(12) United States Patent
Anselm et al.

(10) Patent No.: US 9,356,422 B2
(45) Date of Patent: May 31, 2016

(54) SCRIBE ETCH PROCESS FOR SEMICONDUCTOR LASER CHIP MANUFACTURING

(71) Applicant: Applied Optoelectronics, Inc., Sugar Land, TX (US)

(72) Inventors: Klaus Alexander Anselm, Sugar Land, TX (US); Rajesh Bikky, Houston, TX (US); Stephen Hu, Houston, TX (US); Greg Pickrell, San Leon, TX (US); Nahid Sultana, Sugar Land, TX (US); Jae Yoon Um, Sugar Land, TX (US); Chia Chen David Wong, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 13 days.

(21) Appl. No.: 14/190,765

(22) Filed: Feb. 26, 2014

(65) Prior Publication Data
US 2015/0243558 A1 Aug. 27, 2015

(51) Int. Cl.
*H01L 21/78* (2006.01)
*H01S 5/00* (2006.01)

(52) U.S. Cl.
CPC ........................................ *H01S 5/00* (2013.01)

(58) Field of Classification Search
CPC .............. H01L 2224/04042; H01L 2924/00; H01L 21/78; H01L 2224/48463; H01L 24/05; H01L 27/20; H01L 33/38
USPC ............. 257/E21.599, E27.006; 438/33, 462, 438/464, 50, 753, 928
See application file for complete search history.

(56) References Cited

U.S. PATENT DOCUMENTS

| | | | | |
|---|---|---|---|---|
| 4,236,296 A * | 12/1980 | Woolhouse | ............. | H01L 21/30 148/DIG. 28 |
| 4,237,601 A * | 12/1980 | Woolhouse | ............. | H01L 21/30 257/E21.211 |
| 4,731,790 A * | 3/1988 | Sawai | .................... | H01S 5/0425 372/46.01 |
| 5,418,190 A * | 5/1995 | Cholewa | .................. | H01L 21/78 257/E21.599 |
| 5,693,181 A * | 12/1997 | Bernstein | ................ | H01L 27/20 148/DIG. 28 |
| 5,780,320 A * | 7/1998 | Kinoshita | ........... | H01L 21/3043 257/E21.238 |
| 5,904,548 A * | 5/1999 | Orcutt | ..................... | H01L 21/78 257/E21.599 |
| 6,040,597 A * | 3/2000 | Kim | .................. | H01L 21/76232 257/321 |
| 6,048,747 A * | 4/2000 | Chakrabarti | ............ | H01L 21/78 257/E21.599 |
| 6,075,280 A * | 6/2000 | Yung | ..................... | H01L 21/304 257/620 |
| 6,100,576 A * | 8/2000 | Backlund | ............. | G02B 6/3636 257/522 |
| 8,779,435 B2 * | 7/2014 | Negishi | ................. | H01S 5/0202 257/200 |
| 2001/0013608 A1 * | 8/2001 | Kobayashi | ............ | H01L 29/045 257/88 |
| 2002/0001435 A1 * | 1/2002 | Steinberg | ................. | G02B 6/12 385/49 |

* cited by examiner

*Primary Examiner* — Stephen W Smoot
*Assistant Examiner* — Edward Chin
(74) *Attorney, Agent, or Firm* — Grossman Tucker Perreault & Pfleger, PLLC; Norman S. Kinsella (57) ABSTRACT

An improved scribe etch process for semiconductor laser chip manufacturing is provided. A method to etch a scribe line on a semiconductor wafer generally includes: applying a mask layer to a surface of the wafer; photolithographically opening a window in the mask layer along the scribe line; etching a trench in the wafer using a chemical etchant that operates on the wafer through the window opening, wherein the chemical etchant selectively etches through crystal planes of the wafer to generate a V-groove profile associated with the trench; and cleaving the wafer along the etched trench associated with the scribe line through application of a force to one or more regions of the wafer.

30 Claims, 6 Drawing Sheets

SCRIBE ETCH PROCESS FOR SEMICONDUCTOR LASER CHIP MANUFACTURING

TECHNICAL FIELD

The present disclosure relates to semiconductor laser chip manufacturing and more particularly, to an improved scribe etch process for semiconductor laser chip manufacturing.

BACKGROUND INFORMATION

The fabrication of edge-emitting semiconductor lasers generally requires the separation of a semiconductor wafer into individual chips where, for example, each chip comprises a laser. The separation process may typically be accomplished by sawing, laser cutting or cleaving the wafer. Due to the relatively small size of the chips and the fact that the quality of the chip edge is important for proper laser operation, cleaving has been a preferred process for the production of semiconductor laser chips. The cleaving process generally involves the scribing of marks on a portion of the semiconductor wafer and then applying a force which causes the semiconductor to break along a crystal plane that is aligned with the scribe mark.

There are, however, several problems with the current scribing process. One problem is that the scribing requires relatively high precision tooling which is slow and expensive. Furthermore, the precision of the break is limited by the precision of the scribe mark. Another problem is that the scribing process can create particles, damage, and chipping on the laser chip. Additionally, coatings applied to the wafer or may interfere with the scribing process. What is needed, therefore, is an improved scribing process that avoids these issues.

BRIEF DESCRIPTION OF THE DRAWINGS

These and other features and advantages will be better understood by reading the following detailed description, taken together with the drawings wherein.

DETAILED DESCRIPTION

The fabrication of edge-emitting semiconductor lasers, consistent with embodiments described herein, generally includes the separation or singulation of a semiconductor wafer into individual chips (e.g., laser chips) using an improved scribing process to facilitate cleaving of the wafer along the scribe lines. The improved scribing process may employ chemical etching to produce an etched trench on the wafer level which increases cleaving precision and reduces process time. Because the scribe line is formed by chemical etching, there may be less opportunity for mechanical damage and particle generation (e.g., contamination) in the process and the likelihood of chipping the laser during the cleaving process may be reduced. The etched trench may be formed as a V-shaped groove, to increase the precision of the cleave break, through the use of an etchant chemical that etches the semiconductor crystal planes of the wafer in a selective manner. The use of an etched V-groove to guide the cleave when singulating devices, as will be explained in greater detail below, may improve the throughput and yield of laser chip production. Additionally, improving the precision of the chip dimensions may facilitate hybrid integration of laser chips into photonic integrated circuits. It will be appreciated, however, that the processes and methods described herein for fabrication of laser chips may also be applied to the fabrication of other semiconductor devices and materials.

As used herein, and consistent with standard crystallography nomenclature, the term <x,y,z> indicates a direction vector in an x,y,z coordinate system. For example, <1,0,0> defines a vector in the x-direction. Likewise, the term (x,y,z) indicates a plane in the x,y,z coordinate system. For example, (1,0,0) defines a plane that is perpendicular to the <1,0,0> direction.

Figure 1:
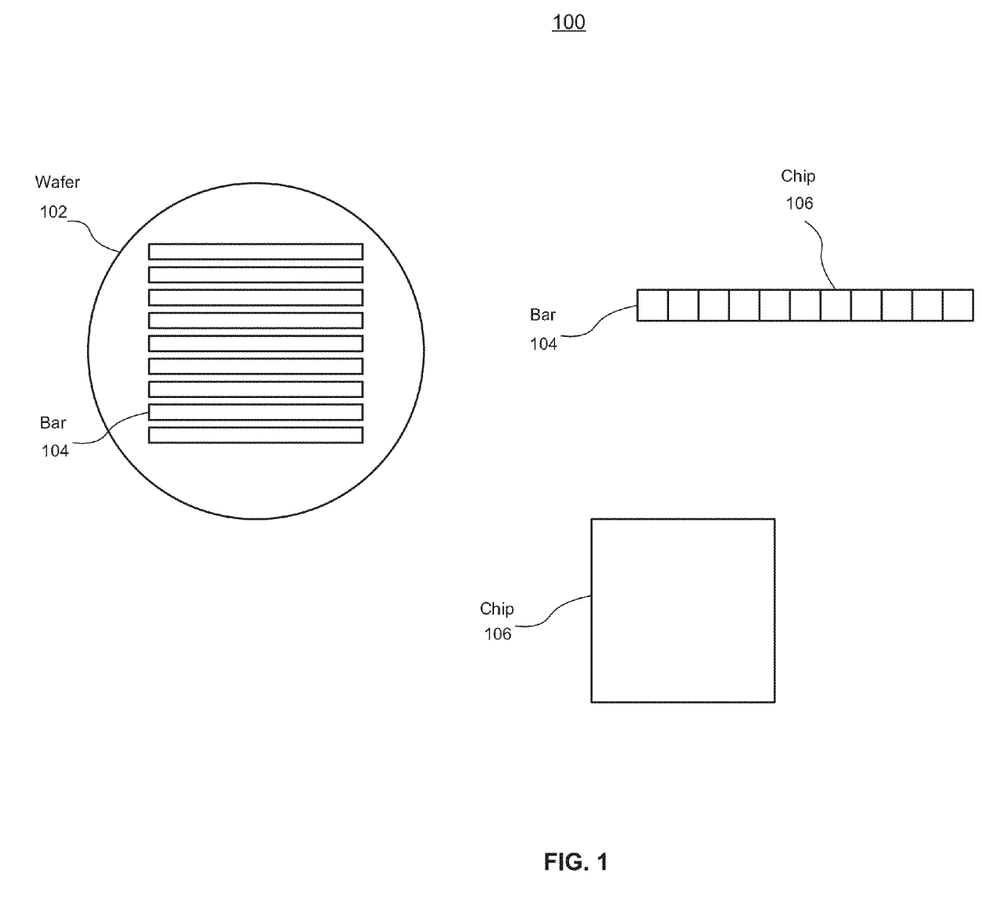
FIG. 1 is a top level diagram of a chip singulation process consistent with embodiments of the present disclosure.

Referring to FIG. 1, a top level diagram of a chip singulation process, consistent with embodiments of the present disclosure, is shown and described. A semiconductor wafer 102 is cleaved along a first dimensional axis (in the plane of the surface of the wafer) into bars 104. The bars may then be cleaved or diced along a second dimensional axis (e.g., perpendicular to the first dimensional axis, but still in the plane of the surface of the wafer) to produce chips 106. Each chip may comprise an edge emitting semiconductor laser. The cleaving (or dicing) involves the application of a force on the wafer (or bar) in proximity to a scribe line that causes a break along a crystal plane that is aligned with the scribe line. The scribe line may be an etched trench that is formed on the wafer level using a combination of photolithography and a chemical etching process. If the bottom, or base, of the scribe line's etched trench is flat or rounded, the cleaving will be more difficult and may not necessarily break at the desired location. It may therefore be desirable to form the trench with a V-groove etch profile as described below for a more precise cleave along the scribe line. The V-groove profile, as will be illustrated and explained with reference to FIG. 2 below, may comprise trench side walls that are angled to meet at a point at the bottom of the trench. The meeting point may therefore be relatively sharp as compared to a U-shaped profile. In some embodiments, the angle, as measured from one trench side wall to the opposite trench side wall (see 210 of FIG. 2) may range from 60 degrees to 100 degrees.

Figure 2:
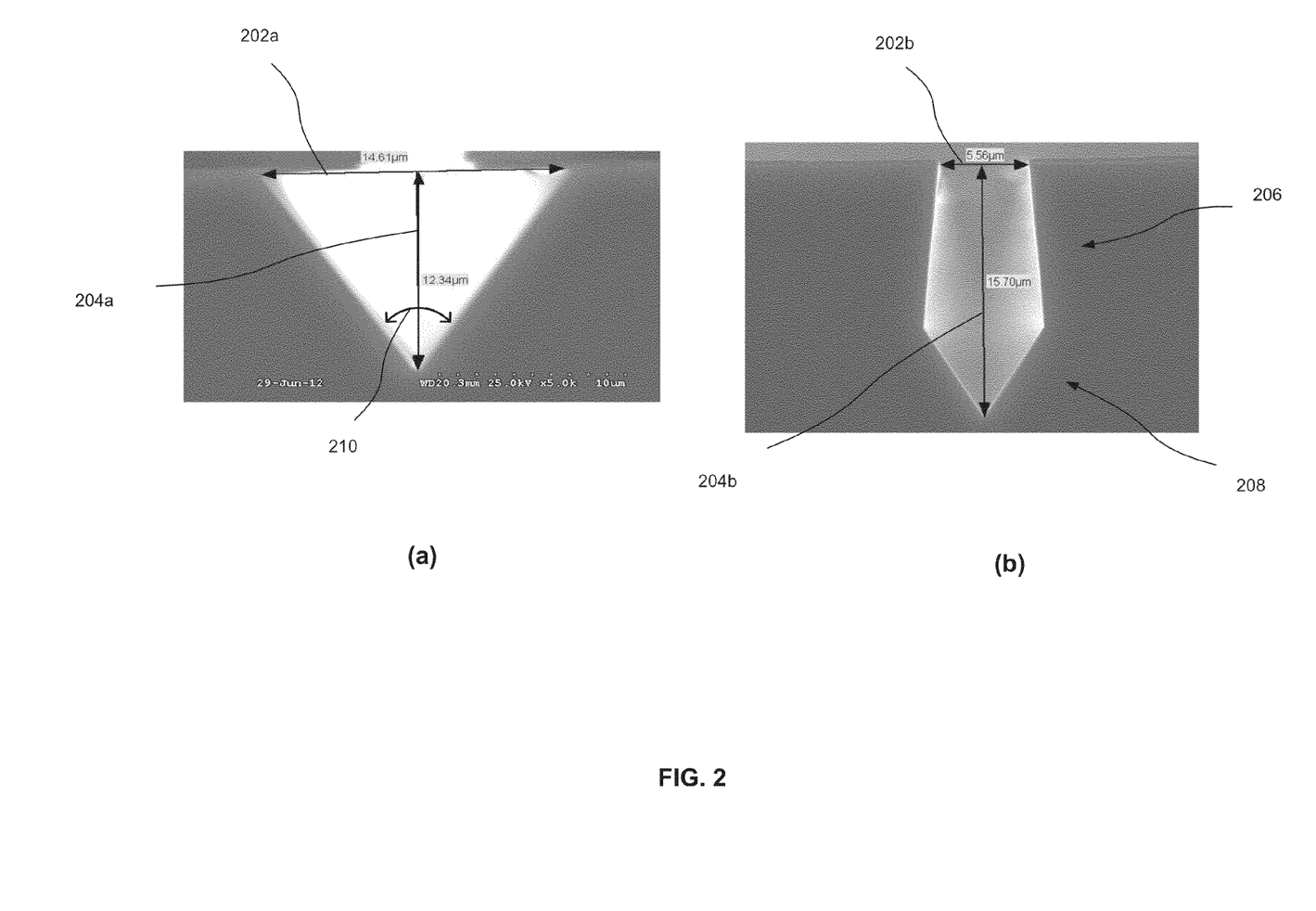
FIG. 2 presents cross sectional images of V-groove etch profiles consistent with an embodiment of the present disclosure.

Referring to FIG. 2, cross sectional images of V-groove etch profiles, consistent with an embodiment of the present disclosure, are presented. FIG. 2(a) illustrates a scanning electron microscope image of a trench with a basic V-groove etch profile (V-groove at bottom of trench). The trench of FIG. 2(a) is shown to have a depth 204a of approximately 12.34 microns and a width 202a of approximately 14.61 microns. The depth of the V-groove is measured along a vertical dimension that may be substantially perpendicular to the surface of the wafer. The width of the V-groove is measured along a horizontal dimension that may be substantially parallel to (e.g., in the plane of) the surface of the wafer. The angle of the V-groove 210 may range from approximately 60 to 100 degrees, where a smaller angle is associated with a sharper V-groove.

Because the width, or lateral extent, of the trench reduces the useable chip area, a modified V-groove etch profile, as illustrated in FIG. 2(b), may be preferred. FIG. 2(b) illustrates a scanning electron microscope image of a trench with a modified V-groove etch profile having a depth 204b of approximately 15.7 microns and a width 202b of approximately 5.56 microns. This modified trench is seen to have an upper portion 206 and a lower portion 208. The lower portion 208 includes the V-groove (at the bottom of the trench) while the upper portion 206 extends up to the surface of the wafer with a tapering width. The geometry of this trench still provides a sharp V-groove but advantageously results in an extended vertical profile while consuming less area on the surface of the wafer.

The desired etch depth is dependent on the wafer material and thickness. In the case of an Indium Phosphide (InP) wafer, for example, that is nominally 100 microns thick, etch depths of 10 to 25 microns may result in good cleaving. Deeper etches, however, may increase the chances of the wafer breaking prematurely. The width of the V-groove depends on the etch time, the composition of the etchant, and the lithographic feature size. Ease of lithography and a typical target etch depth range may result in a width of 4-10 microns generally, but narrower widths are possible if smaller lithographic features are used.

The etching of the V-groove profile may be achieved by using a chemical etchant that selectively etches through the planes of the semiconductor crystal. The process may involve the application of a standard photoresist or a deposited dielectric such as, for example, Silicon Dioxide ($SiO_2$) or Silicon Oxynitride ($SiN_xO_y$) to define the window of the trench. In some embodiments, other types of semiconductor layers may also be used to define the window. The particular etchant that is employed may depend on the type of semiconductor being etched. Different window widths and etch compositions can result in different etch profiles. For laser fabrication, compound semiconductors such as Indium Phosphide (InP) or Gallium Arsenide (GaAs) are typically used as semiconductors. In the case of InP, an etch composition, such as an aqueous solution of Hydrochloric acid of sufficient concentration (for example, $HCl:H_2O$ (4:1)), along with an appropriate window width (for example, 5 microns), can be used to achieve a narrow V-groove etch profile. The etching depth may be set to a value that is sufficient for the process to provide acceptable yields. An etch depth of approximately 10-15 microns is generally sufficient to achieve a suitable cleave on a typical InP laser wafer with chip dimensions (e.g., length and/or width of the surface of the chip) on the order of 250 microns or more.

The V-groove etching process is achieved because the material being etched is crystalline and the etchant exposes specific crystal planes in the material which etch more slowly than other crystal planes. Different planes in the crystal have different electron bonding configurations. Certain chemical etchants react differently on different crystal planes. In the case of InP, HCl and other etchants such as Hydrogen Bromide (HBr) react with some crystal planes more quickly than others. The relative etching rates of the etchant on different crystal planes can be affected by mixing with other chemicals or by different dilution levels with water. The facets that etch more slowly will be exposed by the etchant. Achieving the desired profile depends on both the direction of the trenches being etched and the etch composition. In one embodiment, an InP wafer with a (100) oriented top surface is etched with lines in the <0,1,1> and <0,1,-1> directions with an etchant consisting of $HCl:H20$ (4:1) where HCl is a saturated aqueous solution of Hydrogen Chloride. The angle at the bottom of the 'V' is about 60 degrees. The trenches in this direction can have an aspect ratio (ratio of width to depth) of about 2 to 3.

The etch phenomenon is similar for trenches made in other directions but with different angles and aspect ratios. Trenches along other directions can result in a wider angle and a smaller aspect ratio. HCl is also very selective to other semiconductor compositions, such as Indium Gallium Arsenide (InGaAs) and Indium Gallium Arsenide Phosphide (InGaAsP). Layers of these other semiconductors can therefore also be used as a mask layer for forming the scribe window. Other etchants, including different HCl concentrations and/or HBr, may exhibit similar behavior.

Figure 3:
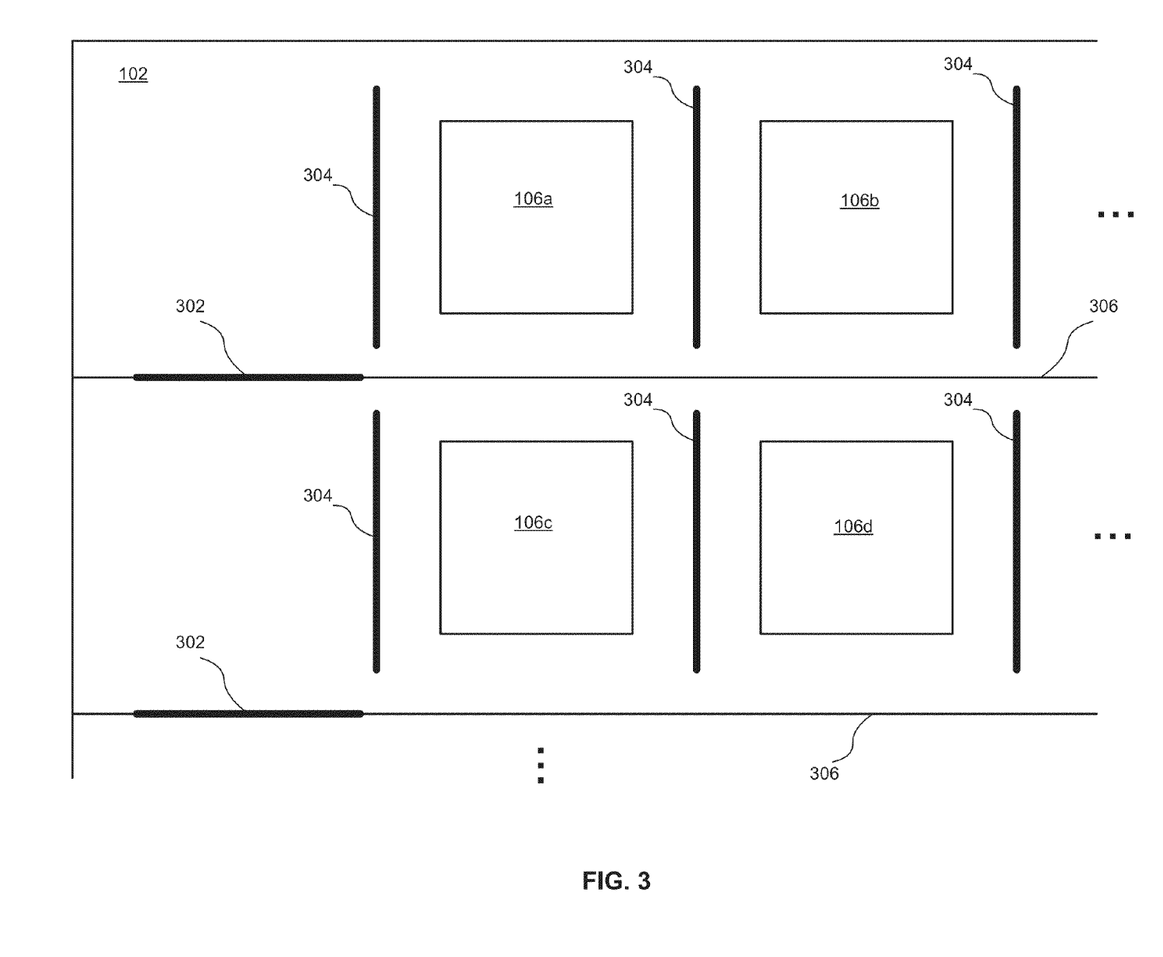
FIG. 3 illustrates an arrangement of scribe etch windows on a chip wafer consistent with an embodiment of the present disclosure.

Referring to FIG. 3, an arrangement of scribe etch windows, consistent with an embodiment of the present disclosure, is illustrated. The scribe etch windows are shown on a portion of the chip wafer 102 comprising four laser chips 106, although in practice there may be any number of laser chips. Chips 106a and 106b may form a first bar and chips 106c and 106d may form a second bar. The bar cleave etch trenches 302 may be located on the wafer 102 at the edge of the bar area (in this illustration on the left edge) and be aligned with the desired bar cleave line 306. The dicing etch trenches 304 may be positioned between the chips 106, as shown. Conventional wafer cleaving/breaking tools may then be used to finish the cleaving process, for example by applying a force to one or more regions of the wafer to cause the wafer to cleave along one or more of the etch trenches 302, 304. First the bars may be cleaved. The bar cleave would start at the bar cleave etch trench 302 and, with application of force from the wafer breaking tool, propagate in the scribe etch direction for the length of the bar. Because perturbations in the semiconductor along the cleave lines could interfere with the formation of a high quality cleave facet, it may be preferable in some applications that the dicing scribe etch trenches 304 not intersect with the cleave line 306. For such an embodiment, the dicing etch window may be patterned so that the dicing etched trenches 304 do not cross the bar cleaving line 306.

In some embodiments, conventional cleaving techniques may be used to cleave the bars while the V-groove scribe etch process described herein may be used for dicing the individual chips from each of the cleaved bars. This may be preferred since the number of diced chips may be much larger (e.g., 50 times larger) than the number of intermediate cleaved bars.

Figure 4:
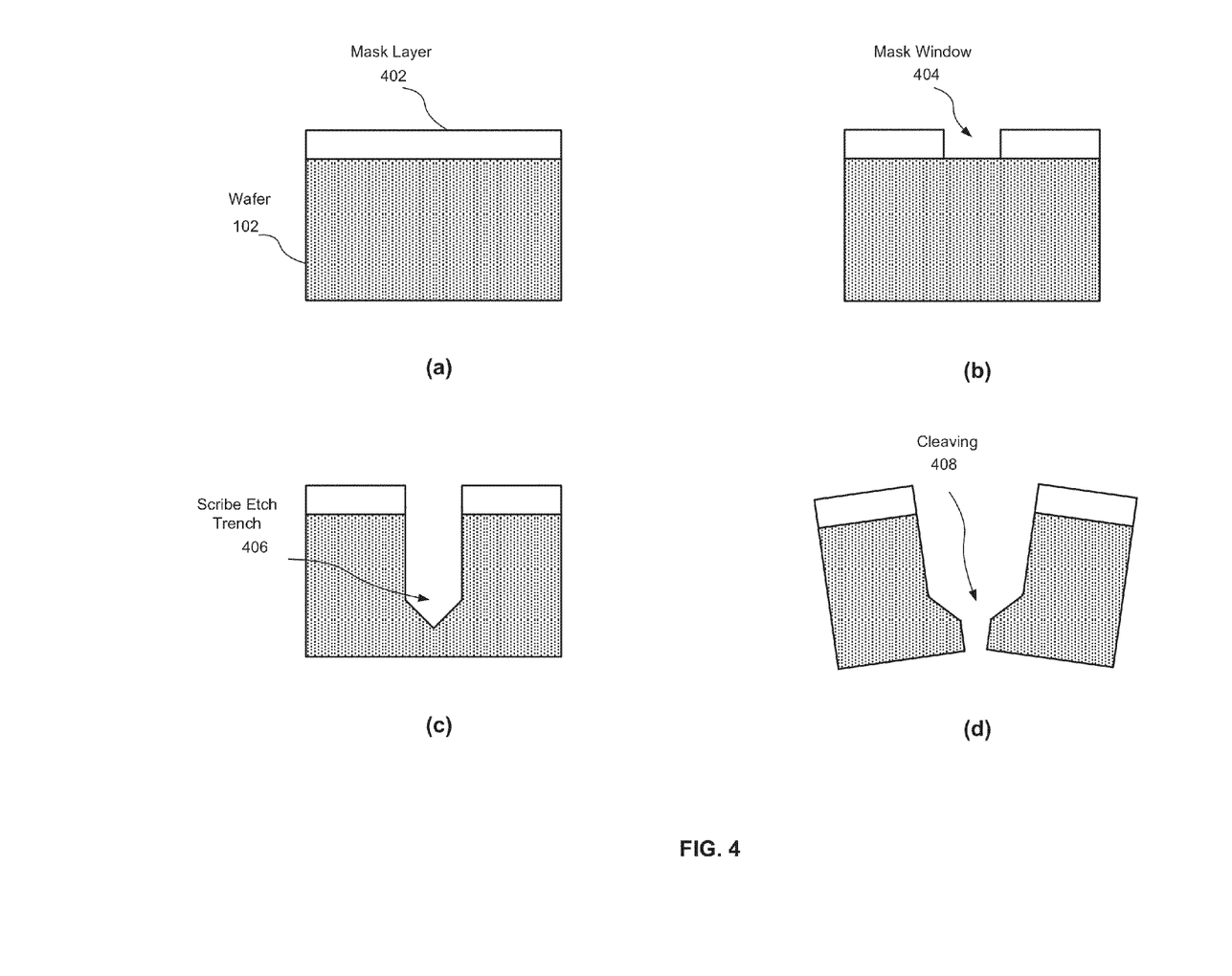
FIG. 4 illustrates a scribe etch process consistent with an embodiment of the present disclosure.

Referring to FIG. 4, a scribe etch process, consistent with an embodiment of the present disclosure, is shown and described. If the alignment tolerance that is achievable by a photolithography aligner is sufficient for the application, then a single mask layer 402 may be used to define the etching windows. The mask layer 402 is applied or coated on a surface of the wafer 102, as shown in FIG. 4(a). A mask window 404 is opened through the mask layer 402 using photolithographic techniques, as shown in FIG. 4(b). The scribe etch trench 406 is then etched in the wafer 102, through the mask window 404, using a chemical etchant, as shown in FIG. 4(c). The wafer is then cleaved 408 along the scribe etch trench 406, as shown in FIG. 4(d), for example using a breaking tool that applies force to one or more regions of the wafer. It will be appreciated, of course, that any number of additional operations, for example any operations associated with chip fabrication, may be performed at any point during the process described above.

Figure 5:
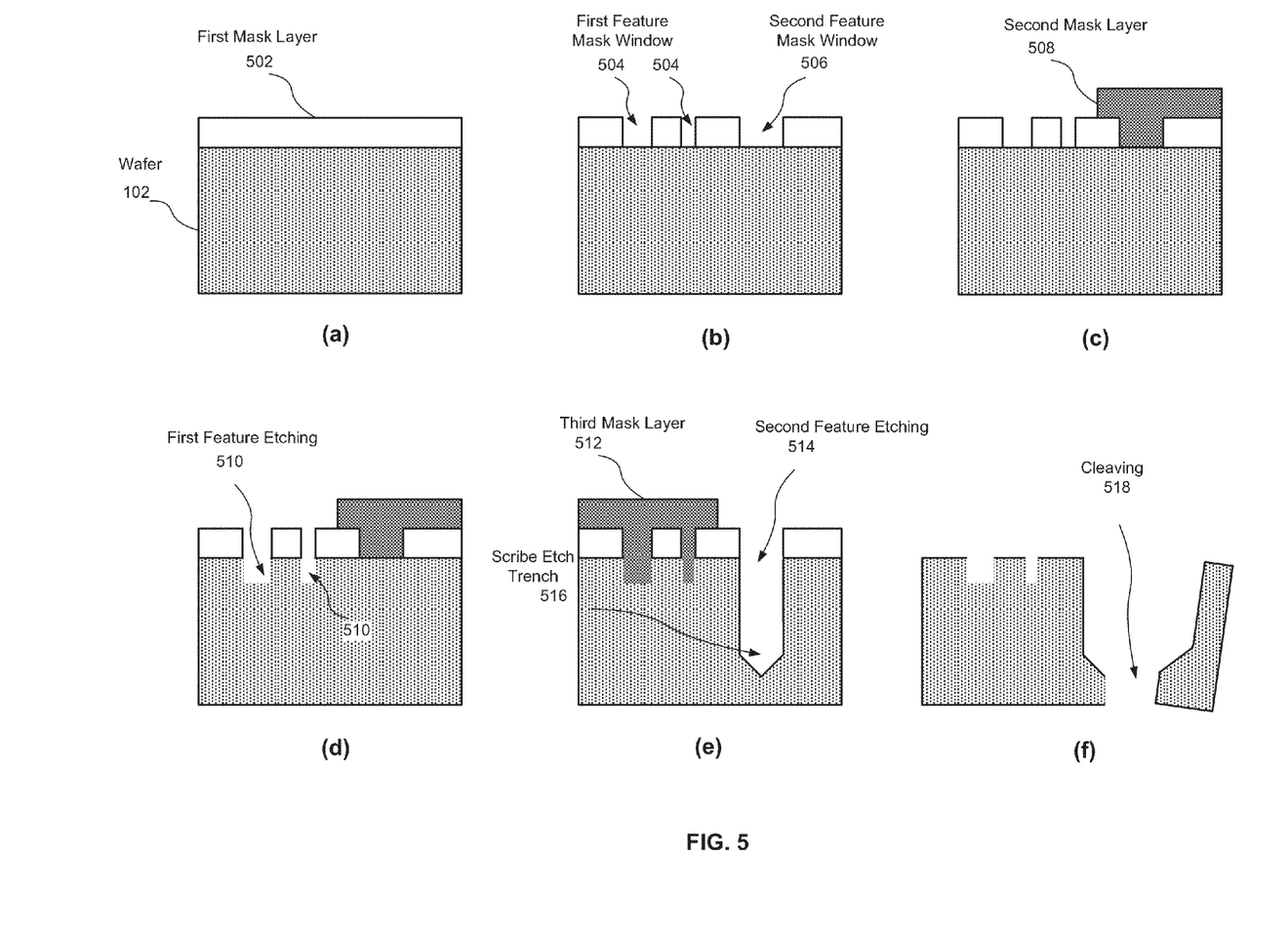
FIG. 5 illustrates a co-aligned scribe etch process consistent with an embodiment of the present disclosure.

Referring to FIG. 5, a co-aligned scribe etch process, consistent with an embodiment of the present disclosure, is shown and described. If the alignment tolerances that are required for an application are more precise than the tolerance that can be achieved by a photolithography aligner, then a co-aligned scribe etch process may be used. In this embodiment, the scribe etch location is co-aligned to other features on the chip, such as, for example, operational components that are being fabricated onto the chip. This enables the edge of the chip to be cleaved at a more precise distance relative to those other features.

A first mask layer 502 is coated on the wafer 102 as shown in FIG. 5(a). The first mask layer 502 is used to define or pattern the position of two or more features, ensuring a desired alignment precision between the features, one of which features may be the etched trench. Mask windows 504 for the first feature and mask window 506 for the second feature (the etched trench in this example) are opened through the mask layer 502 using photolithographic techniques, as shown in FIG. 5(b). Then, using a second and third mask layer 508, 512, the separate features can be formed, as explained below, without the requirement for high precision active alignment. As shown in FIG. 5(c), the second mask layer 508 is applied and then opened over the first feature mask windows 504 so that the second feature mask window 506 is protected. Then, the etching of the first feature 510 may be performed as shown in FIG. 5(d).

The second mask layer 508 may then be removed and the third mask layer 512 may be applied to protect the newly etched first feature 510, as shown in FIG. 5(e). The second feature 514 may then be etched and the scribe etch trench 516 may be formed, as also shown in FIG. 5(e). At this point, the third mask layer 512 and remaining first mask layer 502 may be removed, as shown in FIG. 5(f), and the wafer is cleaved 518 along the scribe etch trench 516.

The second and third masking layers 508, 512 are applied and removed in a manner that does not affect the first mask layer 502. This can be achieved, for example, by etching the first pattern into a deposited dielectric material, such as $SiO_2$ or $Si_xN_y$, or a deposited semiconductor, such as InGaAs or InGaAsP, and using conventional photoresist to form the second and third mask layers. It will be appreciated, of course, that any number of additional operations, for example any operations associated with chip fabrication, may be performed at any point during the process described above.

Figure 6:
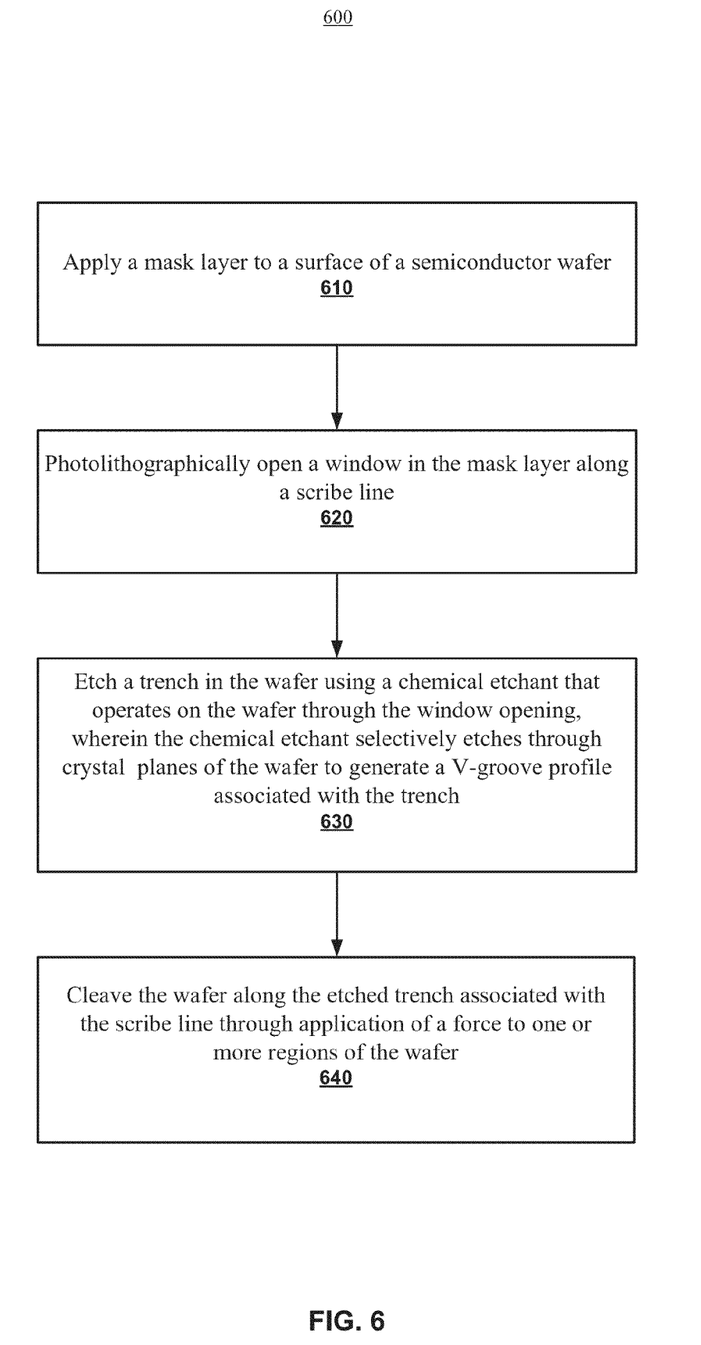
FIG. 6 illustrates a scribe etch process consistent with an embodiment of the present disclosure.

Referring to FIG. 6, a flowchart of operations 600 illustrates a method for etching a scribe line on a semiconductor wafer consistent with another embodiment of the present disclosure. At operation 610, a mask layer is applied to a surface of the wafer. At operation 620, a window is photolithographically opened in the mask layer along the scribe line. At operation 630, a trench is etched in the wafer using a chemical etchant that operates on the wafer through the window opening. The chemical etchant selectively etches through crystal planes of the wafer to generate a V-groove profile associated with the trench. At operation 640, the wafer is cleaved along the etched trench associated with the scribe line through application of a force to one or more regions of the wafer.

Consistent with an embodiment, a method for etching a scribe line on a semiconductor wafer includes applying a mask layer to a surface of the wafer. The method also includes photolithographically opening a window in the mask layer along the scribe line. The method of this example further includes etching a trench in the wafer using a chemical etchant that operates on the wafer through the window opening. The chemical etchant selectively etches through crystal planes of the wafer to generate a V-groove profile associated with the trench. The method of this example still further includes cleaving the wafer along the etched trench associated with the scribe line through application of a force to one or more regions of the wafer.

Consistent with another embodiment, a method for singulating a laser chip from a semiconductor wafer includes cleaving the wafer into one or more bars. The method also includes dicing the bars into one or more of the laser chips. The cleaving and dicing of this example includes applying a force to one or more regions of the wafer such that the wafer breaks along an etched trench. The etched trench of this example is created by applying a mask layer to a surface of the wafer; photolithographically opening a window in the mask layer along a scribe line defining the location of the trench; and etching the trench in the wafer using a chemical etchant that operates on the wafer through the window opening. The chemical etchant of this example selectively etches through crystal planes of the wafer to generate a V-groove profile associated with the trench.

Consistent with another embodiment, a method for singulating a laser chip from cleaved bars of a semiconductor wafer includes dicing the cleaved bars into one or more of the laser chips. The dicing of this example includes applying a force to one or more regions of the wafer such that the wafer breaks along an etched trench. The etched trench of this example is created by applying a mask layer to a surface of the wafer; photolithographically opening a window in the mask layer along a scribe line defining the location of the trench; and etching the trench in the wafer using a chemical etchant that operates on the wafer through the window opening. The chemical etchant of this example selectively etches through crystal planes of the wafer to generate a V-groove profile associated with the trench.

Consistent with another embodiment, a method for co-aligning an etched scribe line to a feature on a semiconductor wafer includes applying a first mask layer over a surface of the wafer. The method also includes opening a window in the first mask layer to expose the feature and the scribe line. The method of this example further includes applying a second mask layer over the surface of the wafer and the remaining first mask layer. The method of this example further includes opening a window in the second mask layer to expose the feature. The method of this example further includes etching the feature in the wafer through the opening in the second mask layer. The method of this example further includes removing the second mask layer. The method of this example further includes applying a third mask layer over the surface and the remaining first mask layer. The method of this example further includes opening a window in the third mask layer to expose the scribe line. The method of this example further includes etching a trench in the wafer using a chemical etchant that operates on the wafer through the opening in the third mask layer, wherein the chemical etchant selectively etches through crystal planes of the wafer to generate a V-groove profile associated with the trench. The method of this example further includes removing the third mask layer and the remaining first mask layer. The method of this example further includes cleaving the wafer along the etched trench associated with the scribe line.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method to etch a scribe line on a semiconductor wafer, said method comprising:

applying a mask layer to a surface of said wafer;
photolithographically opening at least first and second windows in said mask layer, wherein said first window corresponds to a feature other than a scribe line to be formed on said wafer and wherein said second window corresponds to said scribe line to be etched in said wafer co-aligned with said feature other than a scribe line;
etching a trench in said wafer using a chemical etchant that operates on said wafer through said second window opening, wherein said chemical etchant selectively etches through crystal planes of said wafer to generate a V-groove profile associated with said trench; and
cleaving said wafer along said etched trench associated with said scribe line through application of a force to one or more regions of said wafer.

2. The method of claim 1, wherein the width of said V-groove profile is in the range of 4 to 8 microns and the depth of said V-groove profile is in the range of 10 to 25 microns.

3. The method of claim 1, further comprising etching a first set of one or more of said scribe lines along a first dimensional axis of said surface of said wafer and etching a second set of one or more of said scribe lines along a second dimensional axis of said surface of said wafer, wherein said first dimensional axis is perpendicular to said second dimensional axis.

4. The method of claim 3, wherein the lengths of said scribe lines are selected such that said first set of scribe lines does not intersect with said second set of scribe lines.

5. The method of claim 1, wherein said mask layer is a deposited dielectric comprising $SiO_2$.

6. The method of claim 1, wherein said mask layer is a deposited dielectric comprising $SiN_xO_y$.

7. The method of claim 1, wherein said mask layer is a deposited semiconductor comprising Indium Gallium Arsenide (InGaAs) or Indium Gallium Arsenide Phosphide (InGaAsP).

8. The method of claim 1, wherein said mask layer is a deposited photoresist layer.

9. The method of claim 1, wherein said wafer comprises Indium Phosphide.

10. The method of claim 1, wherein said chemical etchant comprises an aqueous solution of Hydrochloric acid.

11. The method of claim 1, further comprising forming a feature other than a scribe line on said semiconductor wafer through the first window such that said etched scribe line is co-aligned with said feature other than a scribe line.

12. The method of claim 1 wherein said V-groove profile is a modified V-groove profile having a lower portion with a V-groove and an upper portion extending to a surface of the wafer and tapering inwardly.

13. A method for singulating a laser chip from a semiconductor wafer, said method comprising:
cleaving said wafer into one or more bars; and
dicing said bars into one or more of said laser chips, wherein said cleaving and dicing comprises applying a force to one or more regions of said wafer such that said wafer breaks along an etched trench, said trench created by:
applying a mask layer to a surface of said wafer;
photolithographically opening at least first and second windows in said mask layer, wherein said first window corresponds to a feature other than a scribe line to be formed on said wafer and wherein said second window corresponds to a location of said trench to be etched in said wafer co-aligned with said feature other than a scribe line; and
etching said trench in said wafer using a chemical etchant that operates on said wafer through said second window opening, wherein said chemical etchant selectively etches through crystal planes of said wafer to generate a V-groove profile associated with said trench.

14. The method of claim 13, wherein the width of said V-groove profile is in the range of 4 to 8 microns and the depth of said V-groove profile is in the range of 10 to 25 microns.

15. The method of claim 13, wherein said etched trench associated with said cleaving does not intersect with said etched trench associated with said dicing.

16. The method of claim 13, wherein said mask layer is a deposited dielectric comprising $SiO_2$ or $SiN_xO_y$.

17. The method of claim 13, wherein said mask layer is a deposited semiconductor comprising Indium Gallium Arsenide (InGaAs) or Indium Gallium Arsenide Phosphide (InGaAsP).

18. The method of claim 13, wherein said mask layer is a deposited photoresist layer.

19. The method of claim 13, wherein said wafer comprises Indium Phosphide.

20. The method of claim 13, wherein said chemical etchant comprises an aqueous solution of Hydrochloric acid.

21. The method of claim 13, wherein said laser chip is an edge emitting semiconductor laser.

22. A method for singulating a laser chip from cleaved bars of a semiconductor wafer, said method comprising:
dicing said cleaved bars into one or more of said laser chips, wherein said dicing comprises applying a force to one or more regions of said wafer such that said wafer breaks along an etched trench, said trench created by:
applying a mask layer to a surface of said wafer;
photolithographically opening at least first and second windows in said mask layer, wherein said first window corresponds to a feature other than a scribe line to be formed on said wafer and wherein said second window corresponds to a location of said trench to be etched in said wafer co-aligned with said feature other than a scribe line; and
etching said trench in said wafer using a chemical etchant that operates on said wafer through said second window opening, wherein said chemical etchant selectively etches through crystal planes of said wafer to generate a V-groove profile associated with said trench.

23. A method to co-align an etched scribe line to a feature other than a scribe line on a semiconductor wafer, said method comprising:
applying a first mask layer over a surface of said wafer;
opening at least first and second windows in said first mask layer, wherein said first window corresponds to said feature other than a scribe line to be formed on said wafer and wherein said second window corresponds to said scribe line to be etched in said wafer co-aligned with said feature other than a scribe line;
applying a second mask layer over said surface of said wafer and said remaining first mask layer;
opening said second mask layer to expose said first window corresponding to said feature;
etching said feature other than a scribe line in said wafer through said first window in said first mask layer;
removing said second mask layer;
applying a third mask layer over said surface and said remaining first mask layer;
opening said third mask layer to expose said second window corresponding to said scribe line;
etching a trench in said wafer using a chemical etchant that operates on said wafer through said second window in said first mask layer, wherein said chemical etchant selectively etches through crystal planes of said wafer to generate a V-groove profile associated with said trench;

removing said third mask layer and said remaining first mask layer; and cleaving said wafer along said etched trench associated with said scribe line.

24. The method of claim 23, wherein said opening through said second mask layer and said third mask layer is performed through photolithography.

25. The method of claim 23, wherein the width of said V-groove profile is in the range of 4 to 8 microns and the depth of said V-groove profile is in the range of 10 to 25 microns.

26. The method of claim 23, wherein said first mask layer mask layer is a deposited dielectric comprising $SiO_2$ or $SiN_xO_y$.

27. The method of claim 23, wherein said first mask layer mask layer is a deposited semiconductor comprising Indium Gallium Arsenide (InGaAs) or Indium Gallium Arsenide Phosphide (InGaAsP).

28. The method of claim 23, wherein said second mask layer and said third mask layer is a deposited photoresist layer.

29. The method of claim 23, wherein said wafer comprises Indium Phosphide.

30. The method of claim 23, wherein said chemical etchant comprises an aqueous solution of Hydrochloric acid.

\* \* \* \* \*